ULTRAHIGH FREQUENCY SWEEP GENERATOR

Filed Nov. 2, 1953 3 Sheets-Sheet 1

INVENTOR.
HORACE F. HANTHORN
BY Charles H. Brown
ATTORNEY

June 26, 1956 H. F. HANTHORN 2,752,499

ULTRAHIGH FREQUENCY SWEEP GENERATOR

Filed Nov. 2, 1953 3 Sheets-Sheet 2

INVENTOR.
HORACE F. HANTHORN

BY Charles H. Brown
ATTORNEY

June 26, 1956 H. F. HANTHORN 2,752,499
ULTRAHIGH FREQUENCY SWEEP GENERATOR
Filed Nov. 2, 1953 3 Sheets-Sheet 3

INVENTOR.
HORACE F. HANTHORN

BY Charles H. Brown
ATTORNEY

United States Patent Office 2,752,499

Patented June 26, 1956

2,752,499

ULTRAHIGH FREQUENCY SWEEP GENERATOR

Horace F. Hanthorn, Woodbury, N. J., assignor to Radio Corporation of America, a corporation of Delaware Application November 2, 1953, Serial No. 389,720

15 Claims. (Cl. 250—36)

This invention relates to an ultra-high frequency sweep generator, and more particularly, to an oscillator which may be tuned to a desired center frequency, and which includes means to automatically sweep or wobble the oscillator frequency about the center frequency.

By way of example, the specific embodiment shown herein may be set to oscillate at a center frequency anywhere in a range of from 300 to 1000 megacycles, and the frequency is automatically swept over a range of frequencies having a width of about 10% of the center frequency. A sweep generator is useful, together with a cathode ray oscilloscope, in determining the frequency response characteristics of various equipments such as amplifiers, tuned circuits, transmission line terminations and antennas. The sweep generator of this invention is particularly useful in aligning ultra-high frequency television receivers.

It is a general object of this invention to provide an improved ultra-high frequency sweep generator which is simpler and less expensive than those previously known.

It is another object to provide an improved sweep generator having a substantially constant output amplitude over the sweep frequency range.

It is another object to provide an improved sweep generator the output amplitude of which may be varied over a range of several thousand to one.

It is a further object to provide an oscillator including improved means for setting the oscillator center frequency to any value within a broad range of frequencies.

In one aspect, the invention comprises a triode oscillator tube having grid and plate electrodes connected respectively to the two conductors of a line arranged concentrically in a circular configuration. A shorting capacitor connected across the line determines the effective length of the line and therefore the center frequency of the oscillator. The position of the shorting capacitor along the line is determined by a tuning knob having an axis coaxial with the line. The oscillator frequency is swept about the center frequency by means of a variable sweep capacitor connected to the grid and plate electrodes of the oscillator tube. The sweep capacitor includes reciprocating capacitor plates which are reciprocated with a periodic sine wave motion at the rate of 60 cycles per second. The output frequency therefore sweeps in sinusoidal fashion at a rate of 60 sweeps per second.

The oscillator circuit is basically an ultra-high frequency version of a Colpitts oscillator. The output of the oscillator is taken from the cathode of the oscillator tube thru a variable capacitor-type attenuator and thru a coaxial cable to an output terminal. The output amplitude is prevented from varying during the frequency sweep from the lowest frequency to the highest frequency by means of a leveler circuit. The leveler circuit takes a rectified portion of the output at the cathode of the oscillator tube and automatically adjusts the B+ potential applied to the plate of the oscillator tube to maintain a substantially constant output amplitude during the frequency sweep of the oscillator. Means are provided for blanking the output of the oscillator during the return sweep from the highest frequency to the lowest frequency, and for providing a sine wave horizontal sweep voltage for a cathode ray oscilloscope, the sweep voltage being synchronous with, and in phase with, the output frequency sweep of the oscillator.

These and other objects and aspects of the invention will be apparent to those skilled in the art from the following more detailed description taken in conjunction with the appended drawings, wherein.

Figure 1:
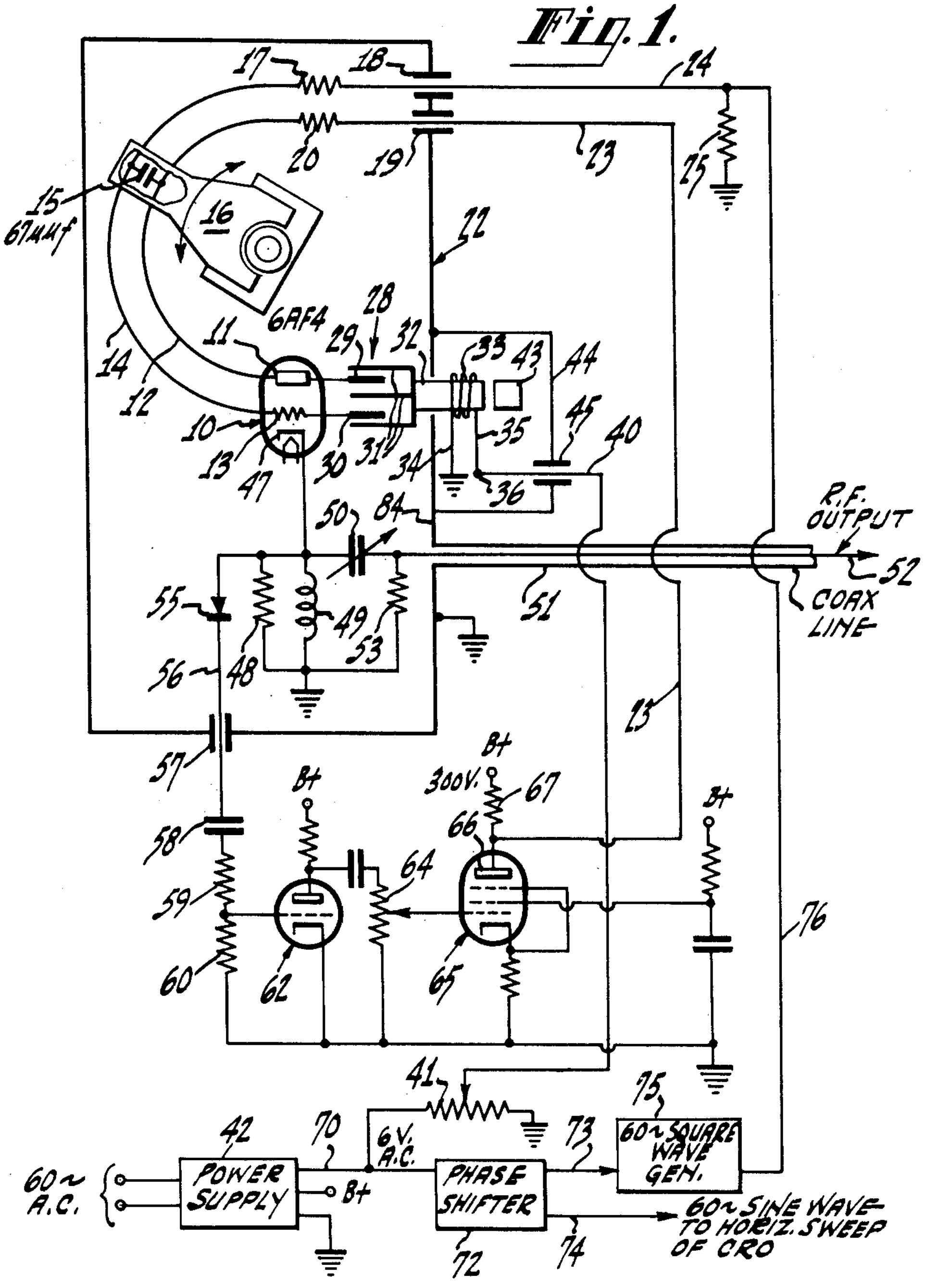
Fig. 1 is a circuit diagram of a presently preferred form of the sweep generator of this invention.
Figure 2:
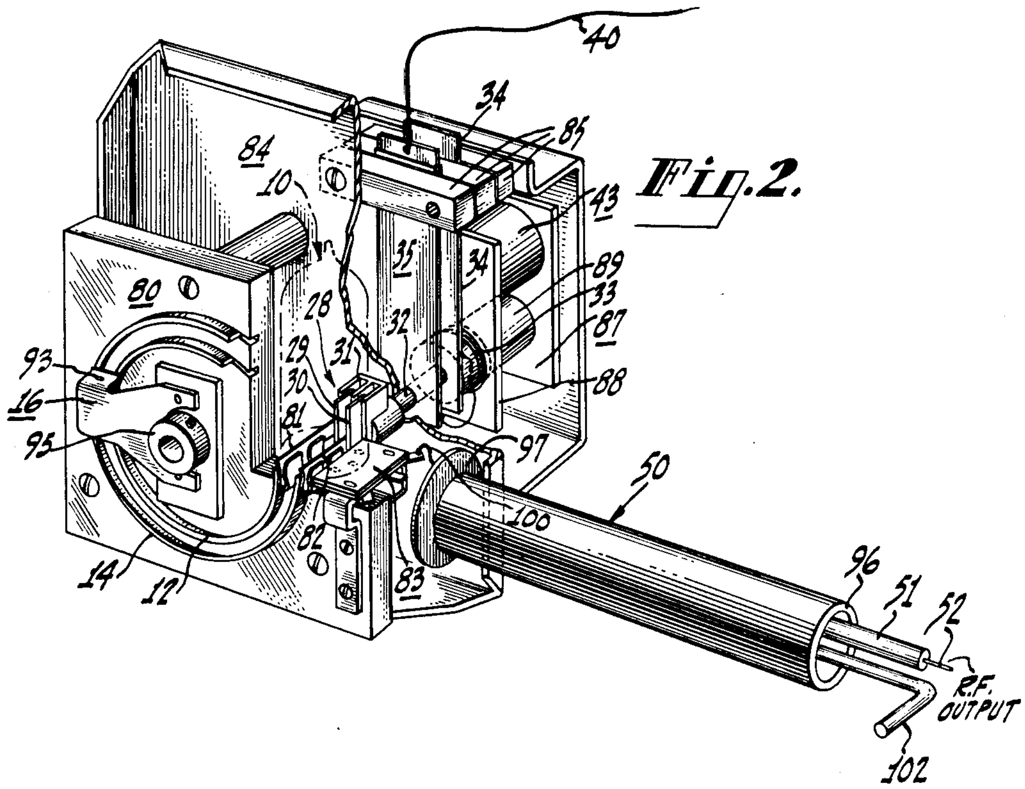
Fig. 2 is a perspective view showing the physical arrangement of the circuit elements of the oscillator in Fig. 1.
Figure 3:
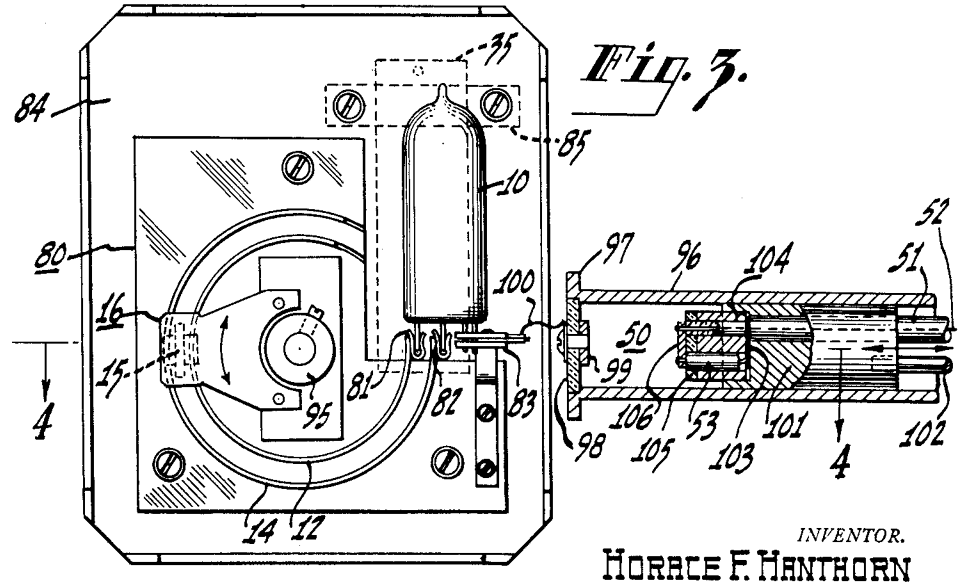
Fig. 3 is a front elevation of the device shown in Fig. 2, the variable attenuator being cut away to show interior details.
Figures 4, 5:
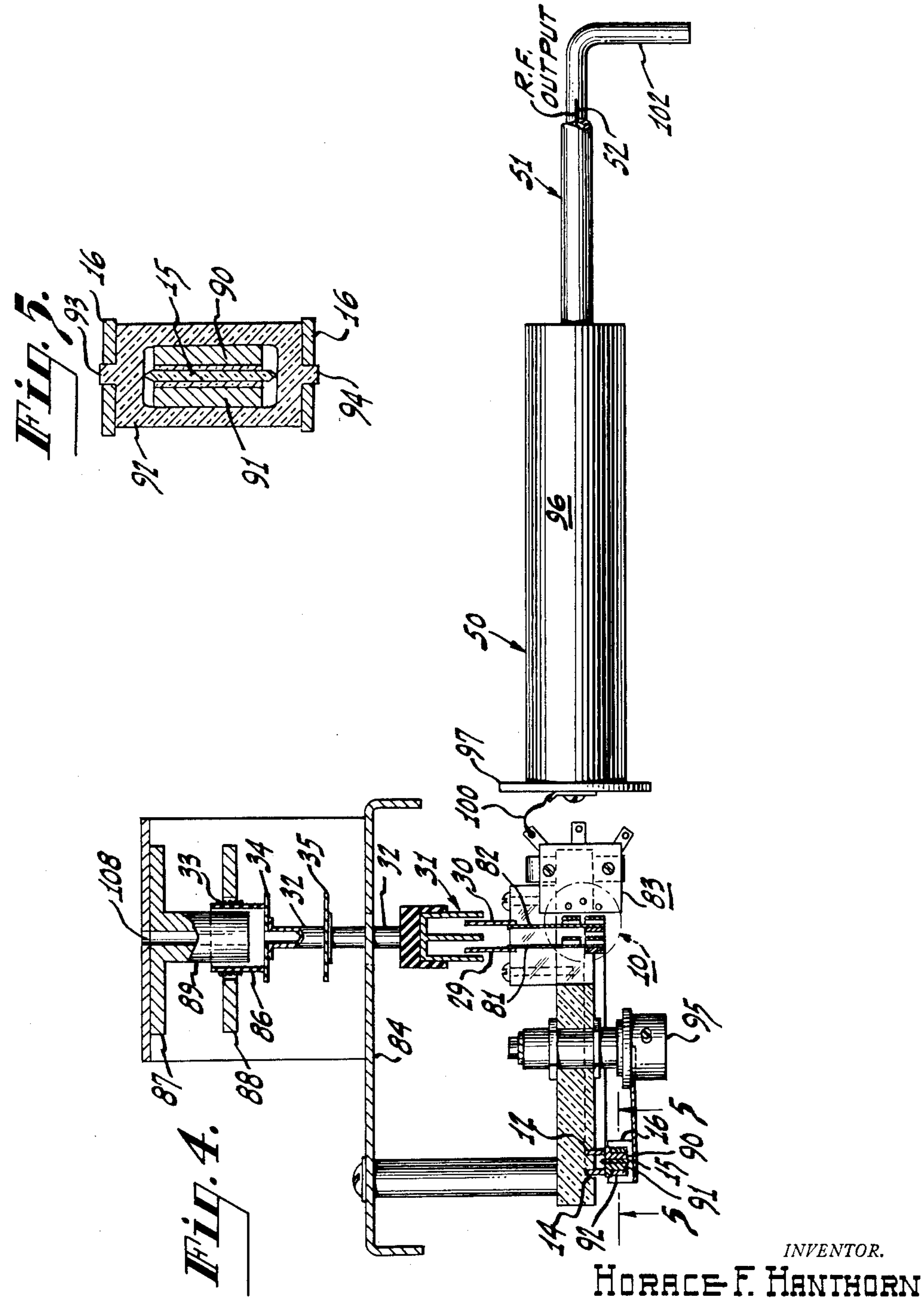
Fig. 4 is a sectional view taken on the line 4—4 of Fig. 3.
Fig. 5 is a sectional view taken on the line 5—5 of Fig. 4 showing the details of the shorting capacitor which is slideable along the tuning line.

Fig. 1 is a diagram of a sweep generator including an oscillator tube 10 which may be an RCA Type 6AF4 vacuum tube. The plate 11 of tube 10 is directly connected to one conductor 12 of a tuning line, and the grid 13 is directly connected to the other conductor 14 of the tuning line. The conductors 12 and 14 are uniformly spaced from each other and are arranged in circular fashion or in arcuate paths. A shorting capacitor 15 is connected across the tuning line 12, 14 by means of sliding contacts which permit the shorting capacitor 15 to be positioned at any point along the line 12, 14. The shorting capacitor 15 may be set at any point along the line by means of a tuning knob (not shown) connected to a rotatable arm 16 which supports the capacitor 15.

The remote end of the line 12, 14 is terminated in its characteristic impedance, the circuit being from line 14, thru terminating resistor 17, thru by-pass capacitor 18, thru by-pass capacitor 19, and thru terminating resistor 20 to conductor 12 of the line. If the characteristic impedance of the line is 440 ohms, resistor 17 and 20 will each have a value of 220 ohms. By-pass capacitors 18 and 19 may consist of feed-thru capacitors mounted in the wall of a shield can 22. The lead 23 connects the plate 11 of tube 10 to a source of B+ potential which will be more fully described as the description proceeds. The lead 24 connects the grid 13 of oscillator tube 10 to ground thru a grid leak resistor 25.

The oscillator frequency is swept in sinusoidal fashion by means of a variable capacitor 28 including stationary plates 29 and 30 connected respectively to the plate 11 and grid 13 of oscillator tube 10. The sweep capacitor 28 also includes reciprocating plates 31 mounted on an insulating cylinder or armature 32 which also carries a coil 33 of the type used for voice coils in loud speakers. One end of coil 33 is connected thru a conductive resilient supporting strip 34 to ground, and the other end of coil 33 is connected thru a conductive resilient supporting strip 35 to a terminal point 36.

Resilient conductors 34 and 35 serve the dual purpose of supplying 60 cycle alternating current to the coil 23 and supporting the armature assembly including coil 33, insulating cylinder 32, and capacitor plates 31. Lead 40 connects terminal point 36 thru a potentiometer 41 to a six volt alternating current output 70 of power supply 42. The coil 33 operates in the magnetic field of a permanent magnet 43 to cause the armature assembly to reciprocate at 60 cycles per second. The lead 40 is taken thru a shield 44 by means of a feed-thru by-pass capacitor 45. The capacitor 45 prevents radio frequency energy from passing over lead 40 to the power supply 42.

The oscillator tube 10 includes a cathode 47 which is connected thru the parallel combination of a cathode resistor 48 and a radio frequency choke 49 to ground. The cathode 47 is also connected thru a variable capacitor-type attenuator 50 and thru a coaxial line 51 to a radio frequency output terminal 52. An impedance matching resistor 53 connects the central conductor of the coaxial line 51 to ground. The mechanical construction of the attenuator 50 and the other parts of the system within the shield cans 22 and 44 will be more fully described in connection with Figs. 2 thru 5.

The radio frequency oscillations present on the cathode 47 of oscillator tube 10 are rectified by a diode 55 which is represented by a symbol including an arrowhead pointing in the direction of electron flow (as contrasted with current flow). The anode of diode 55 is connected over a lead 56 thru a feed-thru by-pass capacitor 57, thru a coupling capacitor 58 and voltage divider resistors 59 and 60 to ground. The intermediate point between voltage divider resistors 59 and 60 is connected to the grid of a conventional voltage amplifier circuit including vacuum tube 62. The output from the plate of tube 62 is coupled thru a potentiometer 64 to the control grid of a power amplifier circuit including vacuum tube 65. The plate 66 of tube 65 is connected thru a plate resistor 67 to the B+ terminal of a source of unidirectional potential 42, by means of a lead not shown. The negative terminal of source 42 is connected to ground. The plate resistor 67 of vacuum tube 65 is also the plate resistor of the oscillator tube 10. Stated another way, B+ potential is applied thru plate resistor 67 to both vacuum tube 65 and over lead 23 and conductor 12 of the tuning line to the plate 11 of oscillator tube 10. The amount of current drawn thru plate resistor 67 by the vacuum tube 65 determines the potential on the plate 66 of tube 65 which is applied to the plate 11 of oscillator tube 10. The tubes 62 and 65 constitute a leveling circuit which is somewhat in the nature of an automatic volume control circuit and which maintains a substantially constant amplitude of radio frequency output at output terminal 52 as the frequency of the oscillator is swept.

The power supply 42 includes an output lead 70 supplying 60 cycle alternating current at 6 volts. This alternating current is applied to a phase shifter 72 having two 60-cycle output leads 73 and 74. Lead 73 is connected to the input of a 60 cycle square wave generator 75 having an output connected over lead 76, lead 24, resistor 17, and line conductor 14 to the grid 13 of oscillator tube 10. The output lead 74 from the phase shifter 72 may be applied to the horizontal sweep circuit of a cathode ray oscilloscope (not shown). The purpose of the phase shifter is to delay the phase of the 60 cycle outputs on leads 73 and 74 by an amount equal to the mechanical phase lag of the armature assembly including coil 33, insulating rod or cylinder 32 and capacitor plates 31.

In the operation of the sweep generator circuit shown in Fig. 1, the oscillator including oscillator tube 10 oscillates at a center frequency determined by the effective length of tuning line 12, 14. The effective length of the tuning line is the distance from the grid and plate of tube 10 to the shorting capacitor 15. The oscillator oscillates at a center frequency such that the effective length of the line is equal to a quarter of a wave length at that frequency. By turning the arm 16 carrying the shorting capacitor 15, the oscillator frequency may be varied to any value in the range between 300 megacycles and 1000 megacycles, according to the present example.

The position of the shorting capacitor 15 along the line 12, 14 determines the center frequency of the oscillator. The frequency sweep about the center frequency is determined by the reciprocating capacitor 28 which is made to reciprocate in a sinusoidal fashion at 60 cycles per second in response to the 60-cycle alternating current applied to coil 33.

The same 60-cycle power from lead 70 which is used to actuate the reciprocating capacitor 28 is applied thru a phase shifter 72 to a 60-cycle square wave generator 75. The phase shifter 72 is adjusted so that the positive half cycle in the output of the square wave generator 75 is exactly in phase with the frequency sweep of the oscillator from the lowest frequency to the highest frequency due to the reciprocating action of capacitor 28. The phase shifter is necessary because of the mechanical time lag in the movement of the capacitor 28 compared with the phase of the alternating current applied thru coil 33. The output of square wave generator 75 is applied over lead 76, lead 24, resistor 17 and conductor 14 of the tuned line to the grid 13 of oscillator tube 10. The output of the square wave generator 75 is thus operative to allow the oscillator to oscillate in the normal fashion during the positive half cycles of the square wave and to render the oscillator tube 10 non-conductive during the negative half cycles of the square wave.

If, for example, the shorting capacitor 15 is positioned at a point along the tuning line such that the center frequency of the oscillator is 500 megacycles, the reciprocating action of sweep capacitor 28 causes the oscillator frequency to sweep over a range of about 50 megacycles (about 10% of the center frequency). The oscillator frequency therefore sweeps between the limits of about 475 megacycles and 525 megacycles. The sinusoidal motion of the reciprocating capacitor 28 is such that the frequency of the oscillator increases at a sinusoidal rate from 475 to 525 megacycles during the positive half cycle of the square wave applied to the grid 13 of the oscillator tube 10. The negative half cycle of the square wave applied to grid 10 then cuts the tube off during which time the reciprocating capacitor 28 returns to its original position.

The output from the oscillator is taken from the cathode 47 of oscillator tube 10 thru a variable capacitor-type attenuator 50 and thru a coaxial line 51 to the output terminal 52. That portion of the sweep generator which has thus far been described provides a radio frequency output at output terminal 52 having an amplitude which may vary as the output frequency sweeps from 475 megacycles to 525 megacycles. In order to maintain a substantially constant radio frequency output amplitude, a leveling circuit is arranged to vary the B+ voltage applied to plate 11 of oscillator tube 10 in a compensating manner. The diode 55 coupled between the cathode 47 of oscillator tube 10 and the grid of the amplifier tube 62 rectifies the radio frequency energy on the cathode of the oscillator tube and applies a proportional signal to the grid of the amplifier tube 62. As the amplitude of the radio frequency energy increases when the frequency sweeps from 475 megacycles to 525 megacycles, an increasingly negative potential is applied to the control grid of the amplifier tube 62. This results in a positive going potential on the plate of the tube 62 which is coupled to the control grid of the power amplifier tube 65. The resulting negative going potential on the plate 66 of power amplifier tube 65 is then applied over lead 23, resistor 20 and conductor 12 to the plate 11 of oscillator tube 10. This reduction in the B+ potential applied to the plate 11 of oscillator tube 10 tends to reduce the amplitude of the oscillations at the cathode 47 of the oscillator tube 10 and at the output terminal 52. Therefore, the action of the leveling circuit is such as to provide a substantially constant amplitude of radio frequency oscillations at the output terminal 52 when the circuit is in the oscillating condition.

A 60-cycle sine wave output on lead 74 from the phase shifter 72 is available for application to the horizontal sweep circuit of a cathode ray oscilloscope. In a use of the sweep generator of this invention, the radio frequency output from terminal 52 will normally be applied to the input of a circuit which is to be analyzed to determine its frequency response characteristics. The output of the circuit being analyzed is applied to the vertical deflection means of a cathode ray oscilloscope. The horizontal deflection means of the cathode ray oscilloscope is controlled by the 60-cycle sine wave from the phase shifter 72 over lead 74. Therefore, the cathode ray in the oscilloscope is swept from left to right at a sinusoidal rate and is returned from right to left at the same rate, a complete sweep occurring 60 times per second. During the time that the cathode ray sweeps from left to right, the radio frequency output of the sweep generator is sweeping from 475 megacycles to 525 megacycles, according to the example being used. During the time that the oscillator frequency would normally return from 525 megacycles to 475 megacycles (the time that the cathode ray returns from the right hand side of the screen to the left hand side) the oscillator is cut-off by reason of the negative half cycle of the square wave applied to the grid 13 of the oscillator tube. The return sweep of the cathode ray therefore establishes a base line on the screen of the oscilloscope. The horizontal axis on the face of the cathode ray oscilloscope is such that frequency varies linearly with distance along the axis. The frequency response characteristic of an equipment being analyzed is evidenced by the vertical deflection of the display at all frequencies (distances) along the horizontal axis.

The physical arrangement and construction of the various elements of the oscillator circuit will now be described with reference to Figures 2 thru 5. Corresponding elements in Figs. 2 thru 5 have been given the same numerals which they bear in Fig. 1. The tuning line consists of metallic ribbons 12 and 14 partially embedded in circular slots in an insulating support 80. The two plate pins of the tube 10 are engaged in a conductive member 81 which is connected at one end to the conductor 12 of the tuning line, and at the other end to the capacitor plate 29 of the reciprocating capacitor 28. The two grid pins of oscillator tube 10 are engaged by a conductive member 82 connected at one end to the conductor 14 of the tuning line, and at the other end to the plate 30 of the reciprocating capacitor 28. The cathode and filament pins of the oscillator tube 10 are engaged in a partial tube socket 83.

The reciprocating plates 31 of the reciprocating capacitor 28 are mounted on an insulating cylinder or rod 32 which extends thru an aperture in the shield 84 which forms a partition between the shield cans 22 and 44 shown in Fig. 1. The insulating rod 32 is supported for reciprocating motion by means of resilient Phosphor bronze strips 34 and 35. Strips 34 and 35 are fixed at their opposite ends by means of mounting blocks 85. Strip 34 is electrically connected to ground thru the mounting blocks 85 and strip 35 is insulated from the mounting blocks and is connected thru a lead 40 to a source of 60-cycle alternating current. Resilient strips 34 and 35 are mounted in a parallel spaced relationship such that the insulating rod 32 is free to reciprocate axially.

The insulating rod 32 supports a coil form 86 upon which is wound the energizing winding 33. Winding 33 is disposed in the magnetic field formed by the permanent magnet 43 in cooperation with the soft iron core assembly including end plates 87 and 88 and cylindrical member 89. The magnetic circuit allows flux to pass from one end of the magnet 43 thru end plate 87, thru cylindrical member 89, radially thru an air gap within which coil 33 is disposed, thru end plate 88 and back to the other end of magnet 43. When alternating current is impressed upon coil 33, the interaction of the magnetic field caused by the current in coil 33 with the magnetic field caused by permanent magnet 43 causes a reciprocation of the assembly including coil 33, coil form 86, insulating rod 32 and capacitor plates 31. The reciprocation of capacitor plates 31 causes the output frequency of the oscillator to sweep in a sinusoidal fashion.

The assembly of the electromechanical vibrator is accomplished with the aid of a centering or aligning pin which is inserted thru the hole 108 in the cylindrical core member 89, and into the hollow insulating rod 32. The aligning pin thus insures that the coil 33 is properly positioned in the aperture in the core plate 88. The clamping blocks 85 are then securely fastened to the shield can so as to fix the upper ends of the resilient conductive strips 34 and 35. The armature including insulating member 32, moveable capacitor plates 31 and coil 33 are then free to reciprocate axially of the insulating member 32 without any mechanical interference with the surrounding cooperating parts. The resilient strips 34 and 35 act substantially as parallel sides of a parallelogram to restrain the motion of the armature assembly to a reciprocation along a substantially straight line.

The shorting capacitor 15 is mounted on a rotatable arm 16 so that it may be positioned at any point along the tuning line 12, 14. The capacitor 15 is a disc type ceramic capacitor to which are soldered two contact legs 90 and 91. Contact legs 90 and 91 make sliding engagement with the tuning line conductors 12 and 13, respectively. The capacitor 15 and contact legs 90 and 91 are fixed in a block of insulating material 92 having coaxial pintles journaled in rotatable arm 16. By this construction, good electrical connection is insured between the conductive legs 90 and 91 and conductors 12 and 14, respectively, of the tuning line. A shaft and tuning knob (not shown) is connected to the socket 95 to rotate the arm 16 and the shorting capacitor 15 along the tuning line. The position of the shorting capacitor 15 along the tuning line 12, 14 determines the center frequency of the oscillator about which the oscillator frequency is swept by the reciprocating capacitor 28.

The output of the oscillator is taken from the cathode of the oscillator tube thru a capacitor type attenuator 50, thru a coaxial line 51 to an output terminal 52. The attenuator 50 includes a metallic cylinder 96 having a flange 97 by which it is mounted on the shield can 22. An insulating disc 98 at the end of cylinder 96 supports a fixed capacitor plate 99 which is connected over lead 100 to the cathode pin socket of tube socket 83.

A metallic piston 101 is reciprocable in cylinder 96 while maintaining electrical contact therewith, the reciprocation being performed by a piston rod 102 to which is connected a dial drive cord (not shown). The piston 101 includes a bore thru which the coaxial output line 51 is passed. The braided outer conductor of the coaxial line 51 is fanned out at 103 and clamped between the piston 101 and a metallic terminal block 104. The central conductor of the coaxial line 51 continues, with its dielectric, thru a bore in the terminal block 104, and thru an insulating disc 105 to a capacitor plate 106. The capacitor plate 106 together with the entire piston assembly, is movable with relation to the fixed capacitor plate 99. The construction of the piston assembly is such that the metallic terminal block 104 continues the electrical characteristics of the coaxial line 51 almost out to the capacitor plate 106. The terminal block 104 and the insulating washer 105 also includes a second bore within which is disposed the resistor 53 having one terminal clamped between the piston 101 and the terminal block 104, and having the other terminal connected to the moveable capacitor plate 106.

When the piston 101 is positioned in cylinder 96 so that capacitor plates 99 and 106 are close together, the maximum coupling, and therefore the maximum radio frequency energy output, is obtained from the oscillator at the output terminal 52. As the piston is withdrawn from the cylinder 96, the coupling between capacitor plates 99 and 106 is reduced so that less radio frequency energy is available from the output terminal 52. The range over which the output energy may be varied is in the order of several thousand to one. The construction of the attenuator 50 is such that disturbing stray effects at the ultra-high frequencies are minimized.

The mechanical construction and arrangement of all of the parts of an ultra-high frequency sweep generator of this invention are designed to minimize the stray effects of the circuit elements at ultra-high frequencies. The construction shown and described permits operation up to and above 1000 megacycles. The tuning line is directly connected to the plate and grid pins of the oscillator tube 10 without the use of a blocking capacitor between conductor 14 and the grid pin. This reduces stray effects between the line and the oscillator tube. The construction is possible because the length of the line is determined by a shorting capacitor 15 rather than a metallic conductive shorting element. The shorting capacitor 15 provides insulation between the direct current paths for biasing the plate and grid of the oscillator tube.

The remote end of the tuning line 12, 14 is terminated in its characteristic impedance, while isolating the direct current bias potential on the line, so that there are no reflections from the end of the line to disturb the proper operation of the oscillator circuit. During the half cycles of the 60 cycle sine wave during which the oscillator is operative, a substantially constant radio frequency output amplitude is achieved by the leveler circuit including vacuum tubes 62 and 65. The amount of gain in the leveling circuit is preset by an adjustment of potentiometer 64 so that the output amplitude remains substantially constant.

What is claimed is:

1. An oscillator comprising, a vacuum tube having cathode, grid and plate electrodes, a two conductor tuning line having one conductor directly connected to said plate and the other conductor directly connected to said grid, means to apply direct current bias potentials thru said line respectively to said plate and said grid, a shorting capacitor connected between the conductors of said line to determine the effective length of said line and the frequency of oscillation of the oscillator, and an output circuit including a resistor and an inductor connected in parallel from said cathode to a point of reference potential.

2. An oscillator as defined in claim 1 wherein said line is arranged in a circular configuration, and in addition, a rotatable arm for moving said shorting capacitor along said line.

3. An oscillator as defined in claim 1, and in addition, means to sweep the frequency of said oscillator comprising stationary capacitor plates directly connected to said plate electrode and said grid electrode, moveable capacitor plates arranged to vary the capacitance between said stationary capacitor plates, and a vibrator mechanism operative to vibrate said moveable capacitor plates.

4. An oscillator as defined in claim 3, and in addition, means to electrically energize said vibrator mechanism to produce a substantially sinusoidal vibrational motion therein, and biasing means operative synchronously with said sinusoidal motion to blank out the oscillations of said oscillator during motion in one direction of said moveable capacitor plates.

5. An oscillator as defined in claim 1, and in addition, an output impedance connected to said cathode, a leveler amplifier, including input and output terminals, diode means coupling said cathode to the input of said leveler amplifier, and means coupling the output of said amplifier through one of the conductors of said tuning line to the plate of said oscillator tube, whereby the radio frequency output amplitude from said oscillator is maintained at a substantially constant value.

6. An oscillator as defined in claim 1, and in addition, an output impedance connected to the cathode of said oscillator tube, a stationary capacitor plate connected to said cathode, a grounded conductive shield surrounding said stationary capacitor plate, a movable capacitor plate reciprocable within said shield to vary the distance between said two capacitor plates, a coaxial output line including an outer conductor connected to ground and an inner conductor connected to said moveable capacitor plate, and an impedance matching resistor having one terminal connected to said moveable capacitor plate and the other terminal connected to said outer conductor of said output coaxial line.

7. A sweep generator comprising an oscillator tube including cathode, grid and plate electrodes, a tuning line including a conductor directly connected to said plate and another conductor directly connected to said grid, said conductors being uniformly spaced and arranged in circular fashion, a shorting capacitor slideably mounted on said line to determine the effective length thereof, means to apply direct current bias potentials to the terminal ends of said line, stationary capacitor plates directly connected to said plate electrode and said grid electrode respectively, a movable capacitor plate effectively disposed between said two stationary capacitor plates, means to periodically move said moveable capacitor plate, and an output circuit including a resistor and an inductor connected in parallel from said cathode to a point of reference potential.

8. An oscillator as defined in claim 7 wherein said circular tuning line is arranged in a given plane, and wherein said moveable capacitor plate moves in a reciprocating fashion in a direction substantially at right angles with said given plane.

9. An oscillator comprising an oscillator tube including cathode, grid and plate electrodes, a tuning line including two spaced conductors connected directly to said plate and grid respectively, a shorting capacitor connected across said line to determine the effective length thereof, an output impedance connected from said cathode to a point of reference potential, an amplifier circuit, means including a diode and a coupling capacitor in series coupling the cathode of said oscillator tube to the input of said amplifier, means capable of passing direct current connecting the output of said amplifier to the terminal end of the tuning line conductor connected to said plate, and means to periodically render said oscillator tube non-conductive.

10. An oscillator as defined in claim 9 wherein said means to periodically render the oscillator tube non-conductive comprises a source of a square wave, and means capable of passing direct current coupling the output of said source to the terminal end of the tuning line conductor connected to the grid of said oscillator tube.

11. A sweep generator comprising, an oscillator tube including cathode, grid and plate electrodes, a tuning line including a plate conductor connected to said plate and a grid conductor connected to said grid, a shorting capacitor connected across said line to determine the effective length thereof, a variable capacitor connected to said plate and said grid, an electromechanical vibrator connected to said capacitor to periodically vary the capacitance thereof, a source of low frequency alternating current power, means to energize said electromechanical vibrator from said source of power, a phase shifter having an input connected to said source of power, a square wave generator having an input connected to the output of said phase shifter, means connecting the output of said square wave generator to the terminal end of said tuning line grid conductor, whereby said square wave generator operates synchronously with the movement of said vibrator means, means to apply a positive bias potential to the terminal end of the plate conductor of said tuning line, and an output impedance connected from said cathode to a point of reference potential.

12. A sweep generator as defined in claim 11, and in addition, a leveler amplifier, means including a diode and a coupling capacitor coupling said cathode to the input of said leveler amplifier.

13. A sweep generator as defined in claim 11, wherein said means to apply a positive bias to the terminal end of the plate conductor of said tuning line comprises a leveler amplifier having input and output terminals, means coupling said cathode to the input of said amplifier, and means coupling the output of said amplifier to the terminal end of said plate conductor of the tuning line.

14. A sweep generator comprising an oscillator tube including cathode, grid and plate electrodes, a tuning line including a plate conductor directly connected at one end to said plate and a grid conductor directly connected at one end to said grid, said conductors being uniformly spaced from each other and arranged in arcuate paths, a shorting capacitor having terminals engaging the two conductors of said line, a rotatable arm for moving said shorting capacitor along said line, a first stationary capacitor plate directly connected to said plate electrode, a second stationary capacitor plate directly connected to said grid electrode, at least one movable capacitor plate mounted adjacent said stationary capacitor plates to vary the capacitance between said plate and grid electrodes, a vibrator mechanism mechanically connected to said movable capacitor plate and including an operating coil, a sinusoidal alternating current source having an output connected to said operating coil, a square wave generator having an input coupled to said source and an output coupled to the free end of said plate conductor, an output impedance connected to the cathode of said oscillator tube, a rectifier having one terminal coupled to the cathode of said oscillator tube, a leveler amplifier having an input coupled to the other terminal of said rectifier and having an output coupled to the free end of said grid conductor.

15. An oscillator comprising, a vacuum tube having cathode, grid and plate electrodes, a two-conductor tuning line having one conductor connected to said plate and the other conductor connected to said grid, means to apply direct current bias potentials respectively to said plate and said grid, a shorting capacitor connected between the conductors of said line to determine the effective length of said line and the frequency of oscillation of the oscillator, and an output circuit including a resistor and an inductor connected in parallel from said cathode to a point of reference potential.

References Cited in the file of this patent

UNITED STATES PATENTS

| | | |
|---|---|---|
| 1,725,639 | Herman | Aug. 20, 1929 |
| 2,103,619 | Hallmark | Dec. 28, 1937 |
| 2,114,036 | Smith | Apr. 12, 1938 |
| 2,126,541 | De Forest | Aug. 9, 1938 |
| 2,160,466 | Usselman | May 30, 1939 |
| 2,261,879 | Higgins | Nov. 4, 1941 |
| 2,292,254 | Van Beuren | Aug. 4, 1942 |
| 2,353,162 | Kaltenbacher | July 11, 1944 |
| 2,498,529 | Clark | Feb. 21, 1950 |
| 2,650,288 | Bradley | Aug. 25, 1953 |